United States Patent
Runde et al.

(10) Patent No.: US 7,943,928 B2
(45) Date of Patent: May 17, 2011

(54) ESD PROTECTION STRUCTURES FOR SEMICONDUCTOR COMPONENTS

(75) Inventors: Michael Runde, Munich (DE); Gernot Langguth, Munich (DE); Klaus Roeschlau, Grafing (DE); Karlheinz Mueller, Velden (DE)

(73) Assignee: Infineon Technologies AG, Munich (DE)

( * ) Notice: Subject to any disclaimer, the term of this patent is extended or adjusted under 35 U.S.C. 154(b) by 31 days.

(21) Appl. No.: 11/603,340

(22) Filed: Nov. 21, 2006

(65) Prior Publication Data

US 2008/0035924 A1 Feb. 14, 2008

Related U.S. Application Data

(63) Continuation of application No. PCT/DE2005/000896, filed on May 17, 2005.

(30) Foreign Application Priority Data

May 25, 2004 (DE) .......................... 10 2004 026 100

(51) Int. Cl.
*H01L 29/04* (2006.01)
(52) U.S. Cl. ... 257/46; 257/104; 257/109; 257/E27.073; 257/E29.327
(58) Field of Classification Search .......... 257/46, 257/104, 109, 112, 121, 161, 175, 199, 212, 257/328, 367, 480, 484, 497, 594, 601, 603, 257/910, E21.053, 352, 366, E25.002, E27.051, 73, E29.172, 327–329, 332, E31.084, E27.073, E29.327; 438/91, 380, 983
See application file for complete search history.

(56) References Cited

U.S. PATENT DOCUMENTS

| | | | |
|---|---|---|---|
| 6,184,545 B1 * | 2/2001 | Werner et al. ................. | 257/109 |
| 6,710,418 B1 | 3/2004 | Sapp | |
| 6,975,013 B2 * | 12/2005 | Fujihira et al. ................ | 257/471 |
| 7,098,509 B2 * | 8/2006 | Zdebel et al. ................ | 257/355 |
| 2002/0070380 A1 * | 6/2002 | Andoh ........................... | 257/46 |
| 2002/0158723 A1 * | 10/2002 | Miller .......................... | 333/254 |
| 2005/0006706 A1 * | 1/2005 | Stefanov et al. ............. | 257/368 |
| 2005/0051814 A1 * | 3/2005 | Miyake et al. ............... | 257/288 |

FOREIGN PATENT DOCUMENTS

| | | |
|---|---|---|
| EP | 0 905 781 A2 | 3/1999 |
| WO | WO 95/22842 A1 | 8/1995 |

* cited by examiner

*Primary Examiner* — David Vu
*Assistant Examiner* — Suberr Chi
(74) *Attorney, Agent, or Firm* — Slater & Matsil, L.L.P.

(57) ABSTRACT

An ESD protection structure includes a structure to be protected disposed in a semiconductor body. A region of a first conductivity type is disposed within the semiconductor body and a channel is disposed in the semiconductor body and extends through the region of the first conductivity type. A semiconductor of a second conductivity type is disposed within the channel adjacent the region of the first conductivity type such that the region of the first conductivity type and the semiconductor of the second conductivity type form a diode. At least one of the region of the first conductivity type and the semiconductor of the second conductivity type is electrically coupled to the structure to be protected.

25 Claims, 5 Drawing Sheets

ESD PROTECTION STRUCTURES FOR SEMICONDUCTOR COMPONENTS

This application is a continuation of co-pending International Application No. PCT/DE2005/000896, filed May 17, 2005, which designated the United States and was not published in English, and which is based on German Application No. 10 2004 026 100.8, filed May 25, 2004, both of which applications are incorporated herein by reference.

TECHNICAL FIELD

The invention relates to an ESD protection structure for semiconductor components, comprising at least one semiconductor diode, whose p- and n-conducting zones are electrically contact-connected to a respective region of the same charge carrier type, of the structural part to be protected, of the semiconductor component at a first and second contact location.

BACKGROUND

Structures of this type serve to protect the semiconductor components against damage or destruction by uncontrolled electrostatic discharges (ESD) by virtue of the parasitic charges that have accumulated as a result of electrostatic charging being conducted away to one of the supply lines in a targeted manner via the protection structures and thus in low-resistance fashion. This prevents the discharge current, which can be a few amperes, from leading to the avalanche breakdown of the component and thus to the destruction thereof. The ESD protection structures are dimensioned for this purpose in such a way that they impart the required current-carrying capacity to the semiconductor component without themselves being destroyed.

The semiconductor structures, which are becoming smaller and smaller as the integrated density increases, increase the sensitivity of the components to electrostatic charging. In particular the decrease in the thickness of the gate oxide in MOS components that accompanies the miniaturization leads to an increase in the susceptibility of the signal inputs and signal outputs of the semiconductor components, since a breakdown in the gate oxide region, for example, is connected with an injection of electrons into the gate oxide and an acceleration of charge carriers in the channel, which inevitably brings about damage to the component in the case of said discharge currents.

A known embodiment of such ESD protection structures that bring about the protection of the component by targeted bypassing of the charge is the realization of a diode in the semiconductor structure. In this case, this realization of a diode is coordinated such that the breakdown voltage of the diode lies below those of the structural parts to be protected of the semiconductor component. The diode is formed by corresponding doped p- and n-conducting regions in the region of the substrate, which is near the surface. The breakdown takes place via the areas of the regions that adjoin one another vertically or laterally. In this case, the internal resistance of the ESD protection structure is a significant factor. Such diodes generally have a considerable parasitic series resistance, which considerably limits the amount of current that can be shunted. It is possible to reduce the internal resistance of said diodes by enlarging the areas of the active pn junctions, for example in large-area diodes, but this not only increases the capacitance of the input circuit and reduces the chip density of the components, but also increases the costs of the entire semiconductor component.

Furthermore, in the realization of ESD protection structures by implantations in the region near the surface, the currents that flow away in the case of an ESD event near the silicon surface lead to a local temperature increase, reducing the current-carrying capacity even further, and likewise lead to damage of the component, in the case of a locally very large temperature increase.

SUMMARY OF THE INVENTION

Consequently, the invention is based on the object of presenting ESD protection structures which can be produced cost-effectively and by means of which it is possible to obtain higher current-carrying capacities in conjunction with an at least comparable space requirement or an at least comparable current-carrying capacity with a smaller space requirement.

According to the invention, the object is achieved by virtue of the fact that a first zone of one charge carrier type of the semiconductor diode covers at least some sections of the inner area of a channel formed in the semiconductor substrate of the semiconductor component and a second zone of the other charge carrier type is formed such that it adjoins the first zone in the vicinity of said channel, that the first zone is formed by a correspondingly conductively doped polysilicon, and that the free channel region that is not filled by the polysilicon is filled with a dielectric.

The channel-type embodiment of the ESD protection structure makes it possible for the zone of the first charge carrier type as it were to dip into the zone of the second charge carrier type, at least in sections, whereby the area of the active pn junction is significantly enlarged relative to the required chip area and the current-carrying capacity of the ESD protection structure is thus increased to the same extent. In this case, the size of the area of the active pn junction can be set very flexibly for the different ESD protection structures, maximally up to the size of the entire lateral area of the channel.

The ratio between the chip area required for the ESD protection structure and the area of the active pn junction is exceptionally favorable, and an ESD protection structure having a high current-carrying capacity can thus be realized very effectively, if the channel depth is greater than the channel width, as is provided in a particularly advantageous embodiment. In this case, pn junction shall denote both the pn junction and the np junction, depending on the configuration of the ESD protection structure.

The embodiment of the ESD protection structure as a semiconductor diode in a channel with the tried and tested, so-called trench process module enables the targeted production of the first zone that at least partly covers the inner area of the channel. Said first zone may be p-conducting or n-conducting depending on the type of semiconductor component to be protected. The formation of the first zone as p-conducting will be the regular embodiment and the formation as n-conducting will come into consideration, for example, for protecting various components of the CMOS type.

According to the invention, the inner area of the channel is covered by the first zone, at least in some sections, which in principle, also includes the partial filling of the channel with a different material, as long as the electrical contact between the first zone and a region of the same charge carrier type of the structural part to be protected of the semiconductor component, referred to as first contact location hereinafter, is realized in order to ensure that the charge is bypassed via said first contact location in the ESD case. As a rule, however, the entire inner area of the channel will be covered with the first zone.

The pn or np semiconductor diode is formed on account of the dopings of the first and second zones, in which case the second zone may be formed, in particular, by the well of the semiconductor component to be protected and the doping of the second zone is therefore determined accordingly. The second zone, in which the channel is formed, may be for example the n-type well of the semiconductor component, so that the first zone is formed by a polysilicon doped in p-conducting fashion.

The fact of whether the existing structures of the semiconductor component can be used for the second zone or the second zone is produced explicitly in the semiconductor substrate depends on the individual case, on the structures of the semiconductor component and the current-carrying capacity to be produced.

With the use of polysilicon for the first zone, the pn junction of the ESD protection structure according to the invention is connected with very low resistance so that the series resistance of the first zone in the channel becomes lower than the resistance of the pn junction and consequently, the diode breakdown is simultaneously effected on the entire diode area, which also lies deeper in the channel. In this way, the current-carrying capacity of the semiconductor component to be protected is actually determined by the entire active area of the pn junction and can be set directly by way of the process-technological production of the area.

By virtue of the fact that, in a particularly advantageous configuration of the invention, a region of the first zone which is situated in the section of the channel which is further away from the p-type or n-type contact location has a higher doping of the pn junction than the remaining regions of said zone, the location of the first breakdown is shifted into the lower region of the channel in a targeted manner. The voltage drop across the internal resistance of the channel has the effect that the breakdown is subsequently also effected in channel regions that are located higher.

The region of the channel which is not filled by the polysilicon is regularly filled with a dielectric, for example silicon oxide, and the first contact location is formed by virtue of the fact that the region of the same charge carrier type of the structural part to be protected of the semiconductor component, the p-conducting region in the case of a p-conducting first zone, for example, partly overlaps the first zone and the parasitic charge is conducted away via the resultant interface.

If, in an alternative configuration according to the invention, the entire channel is filled by polysilicon, the first contact location can be configured more flexibly and the interface can be maximized in the case of complete overlapping. This configuration is used according to the expected currents to be conducted away and the possibilities for producing the first contact location according to the structure of the semiconductor component.

As set forth above, the area of the active pn junction is possible, in principle, by way of the filling of the channel with the polysilicon of the first zone, but more cost-effectively by way of the formation of the form and size of the second zone adjacent to the first zone.

Thus, according to the required current-carrying capacity, in further configurations of the invention, the second zone may be formed as a buried layer if the first zone covers the inner area of the channel at least in this lower region. If the buried layer has no electrical contact with the region of the same charge carrier type of the structural part to be protected of the semiconductor component, in this case the second contact location is embodied by a third zone, the charge carrier type of which corresponds to that of the second zone and which electrically conductively adjoins the second zone.

Said buried layer may in turn be a layer of the semiconductor component which is used for the ESD protection structures. However, it is equally possible for the second zone to be formed by a well, specially implanted for the ESD protection structures. This has the advantage that the breakdown of the semiconductor diode can be set in a targeted manner by means of the doping of the pn junction.

As an alternative, it may be provided that the first zone covers the entire inner area of the channel, that the second zone is formed such that it adjoins the lower region of the channel as a buried layer, and that a further layer is arranged as a third zone above the buried layer and in a manner electrically insulated from the latter, which further layer has the same charge carrier type as the second zone, and forms the second p-type or n-type contact location. This particular configuration is appropriate for ESD protection structures in BiCMOS components by the utilization of the component structures present there.

For targeted setting of the charge dissipation and the doping of the pn junction, it is possible, moreover, for the magnitude of the doping of the third zone to differ from the magnitude of the doping of the second zone.

Since, as set forth in the introduction, the internal resistance of the semiconductor diodes is to be reduced by enlarging the areas of the active pn junctions and the current-carrying capacity of the ESD protection structures is thus to be increased, particularly advantageous configurations of the invention provide for the channel to have an extended geometrical extent, in particular in the form of strips, meanders or rings.

Since the production of the channel form defines the form of the semiconductor diode and thus the breakdown area, it is possible, depending on the available space for forming the ESD protection structures, to define the form of the channel in such a way as to form an optimum junction area. It is also possible for this purpose for the ESD protection structure to comprise two or more semiconductor diodes.

If, by way of example, the structural parts to be protected of the semiconductor component are the I/O pads thereof, the arrangement of the semiconductor diodes below the pads, for example, in the form of parallel strips or meanders or around the pads is possible in a very effective manner.

It is likewise advantageous in this case for the polysilicon of the first zone to be electrically conductive directly adjoining the pad metallization.

BRIEF DESCRIPTION OF THE DRAWINGS

The invention will be explained in more detail below on the basis of an exemplary embodiment. In the associated drawings.

The following list of reference symbols can be used in conjunction with the figures:

| | |
|---|---|
| 1 | p-type well |
| 2 | p-type region of the first connection pad |
| 3 | Semiconductor substrate |
| 4 | n-type well |
| 5 | pn junction |
| 6 | Further n-type well |
| 7 | n-type region of the second connection pad |
| 8 | First zone |
| 9 | Channel |
| 10 | Dielectric |
| 11 | First contact location |
| 12 | Second contact location |
| 13 | Second zone |
| 14 | Third zone |
| 15 | Carrier substrate |
| 16 | Buried layer |
| 17 | Metallization of the connection pads |

DETAILED DESCRIPTION OF ILLUSTRATIVE EMBODIMENTS

Figure 1A:
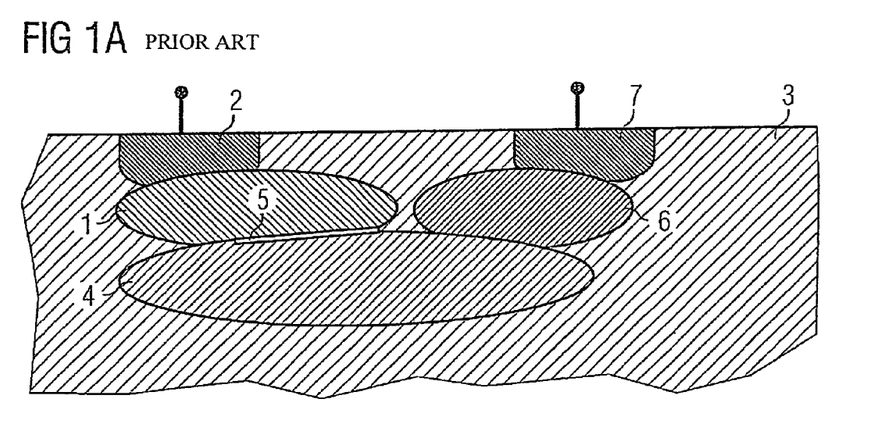
FIGS. 1A and 1B show a schematic illustration of ESD protection diodes according to the prior art.
Figure 1B:
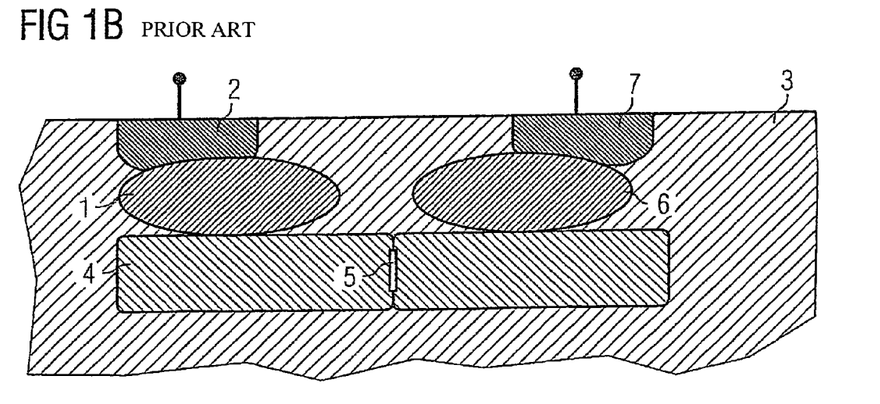

The ESD protection diodes according to the prior art as illustrated in FIGS. 1A and 1B are integrated into the I/O pads of a semiconductor component, which is not illustrated in any greater detail. In both figures they comprise a well doped in p-conducting fashion (p-type well) 1, which is in electrically conductive contact with the p-type region of the first connection pad 2 and to which a well doped in n-conducting fashion (n-type well) 4 is adjacent in the region situated relatively deep in the semiconductor substrate 3. The areas of contact between the p-type and n-type wells 1 and 4 form the areas of the active pn junctions 5 and their sizes are determined directly by the horizontal or vertical extent of the wells. The pn junction 5 has a horizontal extent in FIG. 1A and a vertical extent in FIG. 1B, so that the breakdown of the diodes formed by the p-type and n-type wells 1 and 4 is effected in the vertical direction (FIG. 1A) and lateral direction (FIG. 1B).

The excess charges that have accumulated in the case of an ESD event are conducted away to a supply line in low-resistance fashion via a further n-type well 6, which is in electrically conductive contact with the n-type well 4 of the diode and the n-type region of the second connection pad 7.

Figure 2:
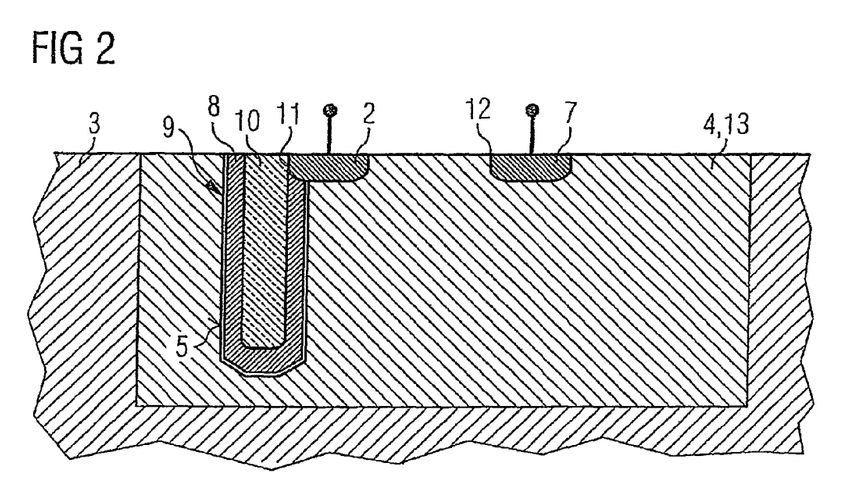
FIG. 2 shows a schematic illustration of an ESD protection structure according to the invention.

The ESD protection structure according to the invention as illustrated in FIG. 2 is likewise a semiconductor diode. It is formed from the p-conducting first zone 8, which completely covers the sidewall or inner area of a channel 9 introduced into an n-type well 4 and the covering has a thickness that is less than half of the channel width. The channel 9, which is consequently not filled, is filled with the dielectric 10 (e.g., silicon dioxide) in the region remaining free.

The first zone 8 is in turn in electrically conductive contact with the p-type region of the first connection pad 2 at the first contact location 11. The n-type well 4 of the semiconductor substrate 3, which well completely surrounds the channel 9, forms the second zone 13, which simultaneously completely encloses the n-type region of the second connection pad 7 (second contact location 12). The area of the active pn junction 5 is formed by the outer area of the channel 9, which corresponds to the sidewalls or inner area and is formed by the interface between the first zone 8 and the second zone 13. In an ESD event, the excess charge is conducted away via a supply line in the known manner.

In order to produce such a semiconductor diode, the structure thereof is formed in parallel with the production of the structure of the semiconductor element, but here reference shall be made only to the production of the ESD protection structure. The channel 9 in its geometrical extent or alternatively a plurality of channels 9 are introduced into the starting material of a sufficiently thick n-doped layer, in particular by anisotropic etching. By deposition of the p-doped polysilicon in the channel 9, the first zone 8 is realized in the envisaged thickness and the dielectric 10 filling the channel 9 is subsequently realized. In the course of the production of the semiconductor component, the p-type and n-type regions of the connection pads 2 and 7 are produced in the n-type well 4 of the starting material.

Figure 3:
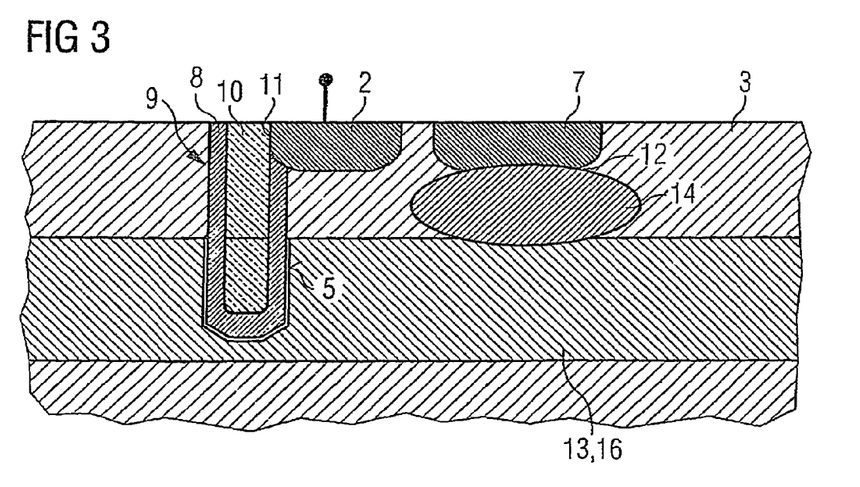
FIG. 3 shows a schematic illustration of an embodiment of the ESD protection structure with a buried layer.
Figure 3A:
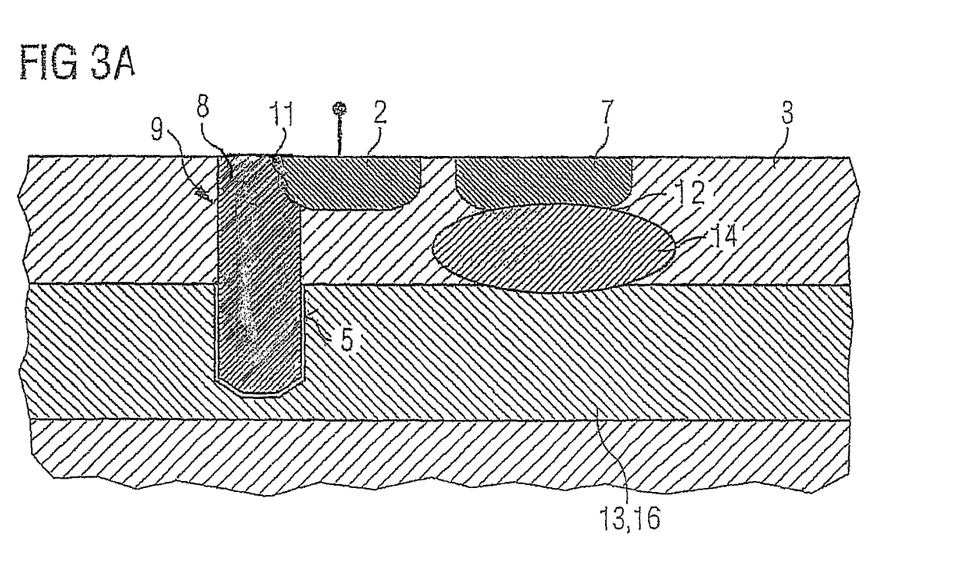
FIG. 3A shows still another embodiment of the ESD protection with a buried layer.

The ESD protection structure according to FIG. 3 and FIG. 3A likewise has the construction of a semiconductor diode and in terms of the essential components is comparable with the semiconductor diode according to FIG. 2. In the embodiments of FIGS. 3 and 3A, the second zone 13 is formed by a buried layer 16, which can be produced by implantation and surrounds the channel 9 in its lower half. Consequently, only this lower section of the outer area of the channel 9 serves as a pn junction 5 between the first zone 8 in the lower region of the channel 9 and the second zone 13 in the buried layer 16. FIG. 3 in a manner similar to FIG. 2 illustrate the first zone 8 only at the sidewalls of channel 9, whereas FIG. 3A shows the polysilicon forming the first zone 8 completely filing channel 9.

The electrical contact-connection of the second zone 13 to the n-type region of the second connection pad 7, for the purpose of conducting away the excess charge to the supply line, is realized by means of a third zone 14 formed as an n-type well. The second contact location 12 is thus realized by said third zone 14 and the n-type region of the second connection pad 7.

Figure 4:
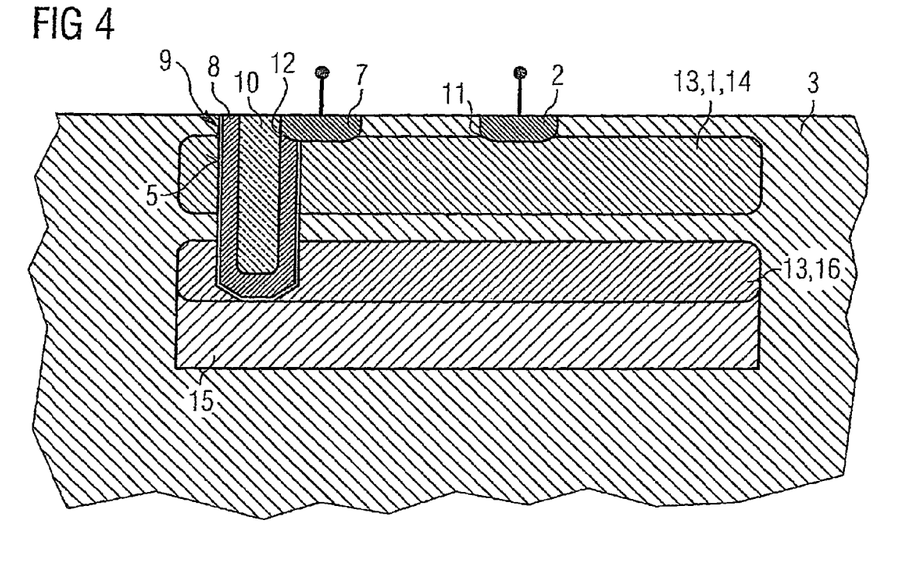
FIG. 4 shows a schematic illustration of an ESD protection structure of a BiCMOS.

The ESD protection structure according to the invention according to FIG. 4 utilizes the existing structures of the BiCMOS component to be protected, a p-conducting carrier substrate 15, a p-conducting buried layer 16 arranged above the latter, and a p-type well 1 embodied as a layer above the latter. In this embodiment, the channel 9 is extended down to the carrier substrate 15, so that it extends both through the p-type well 1 and through the buried layer 16 and the second zone 13 is thus divided up between these two layers. Since the second zone 13 are present as p-doped layers, the first zone 8 in the channel 9 has n-doped polysilicon and is contact-connected to the n-type region of the second connection pad 7.

Figure 5A:
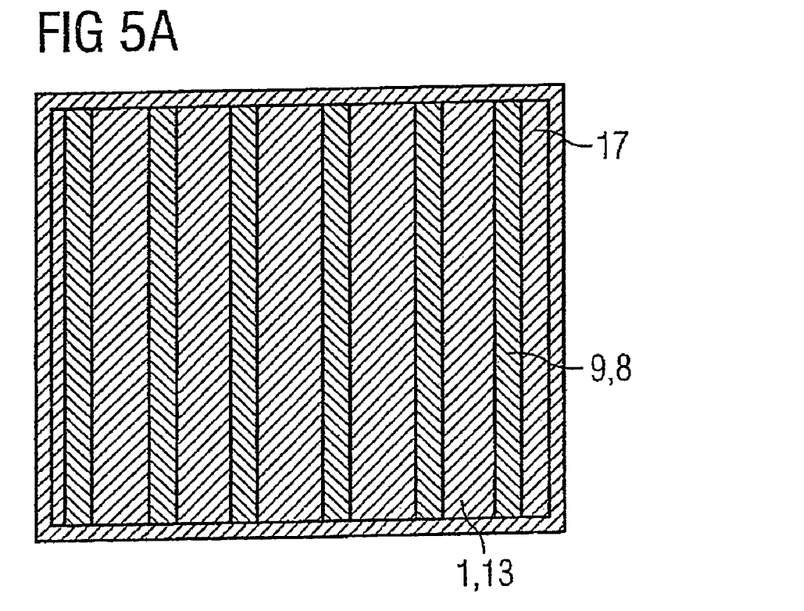
FIGS. 5A and 5B show the illustration of different embodiments of the geometrical arrangement of the ESD protection structures.
Figure 5B:
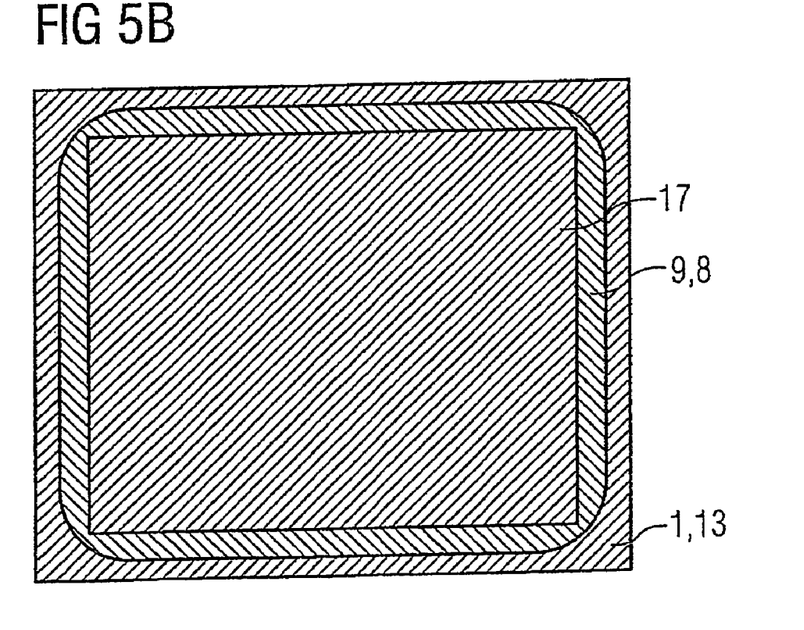

The exemplary embodiments in accordance with FIGS. 5A and 5B represent possible geometrical extents of the ESD protection structures according to the invention, the structures being formed by a plurality of strip-type and parallel semiconductor diodes in FIG. 5A and by an annular semiconductor diode in FIG. 5B. The semiconductor diodes illustrated here have one of the possible structures just described. However, these ESD protection structures are not connected by any semiconductor diode comprising this structure to the p-type and n-type regions of the connection pads 2 and 7, but rather directly to the metallization of the connection pads 17.

What is claimed is:
1. An ESD protection structure comprising:
a first conducting zone of a first conductivity type disposed in a channel having sidewalls connected by a bottom surface, said channel located within a semiconductor body, wherein the first conducting zone is electrically coupled and physically contacts at a first location to a doped region of the first conductivity type; and
a second conducting zone of a second conductivity type disposed in the semiconductor body, the second conducting zone electrically coupled at a second location to a doped region of the second conductivity type, wherein the channel is at least partially disposed in said second conducting zone, and wherein the second conducting zone physically contacts the first conducting zone at the bottom surface and sidewalls of the channel, wherein the first conducting zone comprises conductively doped polysilicon, wherein any portion of the channel that is not filled by the conductively doped polysilicon is filled with a dielectric, and wherein a semiconductor diode is formed only between the first and the second conducting zones.

2. The ESD protection structure of claim 1, wherein the channel has a channel depth and a channel width and wherein the ratio of the channel depth to the channel width is greater than one.

3. The ESD protection structure of claim 1, wherein a portion of the first conducting zone that is further away from the first location has a higher doping concentration than a portion of the first conducting zone that is closer to the first location.

4. The ESD protection structure of claim 1, wherein the entire channel is filled by polysilicon.

5. The ESD protection structure of claim 1, wherein the first conducting zone covers the bottom surface, wherein the first conducting zone covers the sidewalls of the channel at least in a lower region of the channel, and wherein the second conducting zone comprises a buried layer in which the lower region of the channel is disposed.

6. The ESD protection structure of claim 5, wherein the second location is embodied by a third conducting zone of the second conductivity type, the third conducting zone electrically conductively adjoining both the second conducting zone and the doped region of the second conductivity type.

7. The ESD protection structure of claim 6, wherein the third conducting zone has a doping concentration that is different than a doping concentration of the second conducting zone.

8. The ESD protection structure of claim 1, wherein the channel has a geometrical shape that is selected from the group consisting of strips, meanders and rings.

9. The ESD protection structure of claim 1, further comprising at least one connection pad.

10. The ESD protection structure of claim 9, wherein the conductively doped polysilicon of the first conducting zone electrically conductively directly adjoins a metallization of the at least one connection pad.

11. The ESD protection structure of claim 1, wherein the second conducting zone contacts the first conducting zone on a lower part of the sidewalls of the channel and not on a remaining upper part of the sidewalls of the channel.

12. The ESD protection structure of claim 1, wherein the channel is a trench having vertical sidewalls.

13. The ESD protection structure of claim 1, further comprising a an upper portion of the semiconductor body having the first conductivity type surrounding an upper portion of the sidewalls of the channel and physically contacting the first conducting zone, wherein the doped region of the first conductivity type and the doped region of the second conductivity type are disposed in the upper portion of the semiconductor body.

14. The ESD protection structure of claim 1, wherein the first conducting zone is surrounded by a zone of a different conductivity, the zone disposed around an upper portion of the sidewalls of the channel.

15. An ESD protection structure for semiconductor components comprising:

a channel having a sidewall and a bottom surface disposed in a semiconductor substrate of the semiconductor components;

a first zone of a first charge carrier type covering at least some sections of the sidewall of the channel, wherein the first zone comprises doped polysilicon, and wherein a portion of the channel that is not filled by the doped polysilicon is filled with a dielectric;

a first contact location coupled to and physically contacting the first zone, the first contact location having the first charge carrier type; and a second zone of a second charge carrier type, the second charge carrier type being opposite to the first charge carrier type, wherein the first zone is at least partially disposed in the second zone such that the second zone contacts the first zone at the bottom surface and at least a portion of the sidewall of the channel, wherein the first zone and the second zone form a semiconductor diode, wherein the semiconductor diode is formed only between the first and the second zones.

16. The ESD protection structure of claim 15, wherein the second zone contacts the first zone on a lower part of the sidewall of the channel and not on a remaining upper part of the sidewall of the channel.

17. The ESD protection structure of claim 15, further comprising an upper portion of the semiconductor substrate having the first charge carrier type surrounding an upper portion of the sidewall of the channel and physically contacting the first zone, wherein the first contact location is disposed in the upper portion of the semiconductor substrate.

18. An ESD protection structure comprising:

an opening having sidewalls and a bottom surface disposed within a semiconductor body;

a first conducting zone of a first conductivity type lining the sidewalls and the bottom surface of the opening, the first conducting zone electrically coupled and physically contacting at a first location to a doped region of the first conductivity type, wherein the first conducting zone comprises conductively doped polysilicon;

a dielectric filling the opening and disposed over the first conducting zone; and a second conducting zone of a second conductivity type disposed in the semiconductor body, the first and the second conducting zones being arranged to form a semiconductor diode, the second conducting zone electrically coupled at a second location to a doped region of the second conductivity type, wherein the opening extends at least partially into said second conducting zone, wherein the second conducting zone contacts the first conducting zone at the bottom surface and at least a portion of the sidewalls of the opening.

19. The ESD protection structure of claim 18, wherein the ESD protection structure is formed from at least two semiconductor diodes.

20. The ESD protection structure of claim 18, wherein the second conducting zone contacts the first conducting zone on a lower part of the sidewalls of the opening and not on a remaining upper part of the sidewalls of the opening.

21. An ESD protection structure comprising:

a first conducting zone of a first conductivity type disposed in a channel having sidewalls connected by a bottom surface, said channel located within a semiconductor body, wherein the first conducting zone is electrically coupled at a first location to a doped region of the first conductivity type, wherein the first conducting zone comprises conductively doped polysilicon, and wherein any portion of the channel that is not filled by the conductively doped polysilicon is filled with a dielectric;

a second conducting zone of a second conductivity type disposed in the semiconductor body, the second conducting zone electrically coupled at a second location to a doped region of the second conductivity type, the first conducting zone and the second conducting zone being arranged to form a semiconductor diode, wherein the channel having the first conducting zone disposed therein is at least partially disposed in said second conducting zone, and said first conducting zone covers at least some sections of said sidewalls of said channel such that the second conducting zone physically contacts the first conducting zone at the bottom surface and sidewalls of the channel; and a zone of the semiconductor body having the first conductivity type disposed above the second conducting zone, the zone of the semiconductor body having the first conductivity type surrounding at least an upper portion of the sidewalls of the channel and physically contacting the first conducting zone and the second conducting zone, wherein the second conducting zone is disposed within the semiconductor body separating the semiconductor body into the zone of the semiconductor body over the second conducting zone and a remaining substrate portion under the second conducting zone.

22. The ESD protection structure of claim 21, wherein the semiconductor diode is formed only between the first and the second conducting zones.

23. An ESD protection structure comprising:

a buried layer disposed within a substrate, wherein the buried layer having a second doping type separates the substrate into an upper portion of a first doping type and a remaining portion, wherein the second doping type is opposite to the first doping type;

a opening disposed in the substrate, the opening extending through the upper portion of the substrate into the buried layer;

a polysilicon layer having a first doping type lining the opening, wherein the polysilicon layer contacts the buried layer in a lower portion of the opening, wherein the polysilicon layer in an upper portion of the opening contacts the upper portion of the substrate having the first doping type;

a first contact location having the first doping type disposed proximate a top surface of the substrate in the upper portion of the substrate, the first contact location contacting the polysilicon layer; and a second contact location having the second doping type disposed proximate a top surface of the substrate in the upper portion of the substrate, the first contact location being laterally spaced from the second contact location.

24. The ESD protection structure of claim 23, further comprising:

a doped region having the second doping type disposed between the second contact location and the buried layer, the doped region contacting a portion of a top surface of the buried layer.

25. The ESD protection structure of claim 23, wherein a dielectric is disposed over the polysilicon layer and filling the opening.

* * * * *